US012713719B2

(12) United States Patent
In et al.

(10) Patent No.: US 12,713,719 B2
(45) Date of Patent: Aug. 18, 2026

(54) IMAGE SENSOR

(71) Applicant: Samsung Electronics Co., Ltd., Suwon-si (KR)

(72) Inventors: Sungjun In, Suwon-si (KR); Sungchul Kim, Suwon-si (KR); Jaeho Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 361 days.

(21) Appl. No.: 18/512,341

(22) Filed: Nov. 17, 2023

(65) Prior Publication Data

US 2024/0204013 A1 Jun. 20, 2024

(30) Foreign Application Priority Data

Dec. 16, 2022 (KR) ........................ 10-2022-0177538

(51) Int. Cl.
*H10F 39/00* (2025.01)

(52) U.S. Cl.
CPC ......... *H10F 39/802* (2025.01); *H10F 39/807* (2025.01)

(58) Field of Classification Search
CPC ........................................................ H10F 39/00
See application file for complete search history.

(56) References Cited

U.S. PATENT DOCUMENTS 5,962,882 A 10/1999 Sin
8,614,759 B2 12/2013 Watanabe et al.
9,704,911 B2 7/2017 Oh
9,831,279 B2 11/2017 Jin et al.
10,388,682 B2 8/2019 Jin
2021/0235026 A1 7/2021 Xu
2021/0320135 A1 10/2021 Machida
2021/0327932 A1 10/2021 Hsieh et al.

FOREIGN PATENT DOCUMENTS

KR 10-0192954 B1 6/1999
KR 10-2320531 B1 11/2021

OTHER PUBLICATIONS

Yun, Jungbin, et al. "A 0.6 µm Small Pixel for High Resolution CMOS Image Sensor with Full Well Capacity of 10,000 e-by Dual Vertical Transfer Gate Technology." 2022 *IEEE Symposium on VLSI Technology and Circuits* (*VLSI Technology and Circuits*). IEEE, Jun. 12-17, 2022.

*Primary Examiner* — Anthony Ho
(74) *Attorney, Agent, or Firm* — Harness, Dickey & Pierce, P.L.C.

(57) ABSTRACT

An image sensor includes a substrate having a plurality of pixels. Each pixel includes a photoelectric conversion region and a floating diffusion region in the substrate, a pixel transistor including a pixel gate on the first surface of the substrate, a first transmission gate between the photoelectric conversion region and the floating diffusion region, extending into the substrate, and having a first width in a horizontal direction, and a second transmission gate between the photoelectric conversion region and the floating diffusion region, arranged between the pixel gate and the first transmission gate when viewed in a plan view, and having a second width less than the first width in the horizontal direction.

20 Claims, 17 Drawing Sheets

IMAGE SENSOR

CROSS-REFERENCE TO RELATED APPLICATION

This application is based on and claims priority under 35 U.S.C. § 119 to Korean Patent Application No. 10-2022-0177538, filed on Dec. 16, 2022, in the Korean Intellectual Property Office, the disclosure of which is incorporated by reference herein in its entirety.

BACKGROUND

The inventive concepts relate to image sensors, and more particularly, to image sensors including a photodiode.

An image sensor is a device that converts an optical image signal into an electrical signal. An image sensor may include a plurality of pixels. Each pixel may include a photodiode region and a pixel circuit. The pixel circuit receives incident light and converts the light into an electrical signal. The pixel circuit outputs a pixel signal by using charges generated in the photodiode region. As the integration of the image sensor increases, the size of each pixel decreases and the size of each component of the pixel circuit also decreases. Thus, there is a problem that the quality of the image sensor decreases due to a leakage current generated through the pixel circuit.

SUMMARY

Some example embodiments of the inventive concepts provide an image sensor having improved image quality by reducing noise of a pixel circuit.

According to some example embodiments of the inventive concepts, an image sensor may include a substrate having a plurality of pixels. Each pixel of the plurality of pixels may include a photoelectric conversion region and a floating diffusion in the substrate, a pixel transistor including a pixel gate on a first surface of the substrate, a first transmission gate between the photoelectric conversion region and the floating diffusion region, the first transmission gate extending into the substrate, the first transmission gate having a first width in a horizontal direction extending parallel to the substrate, and a second transmission gate between the photoelectric conversion region and the floating diffusion region, the second transmission gate between the pixel gate and the first transmission gate when viewed in a plan view, the second transmission gate having a second width less than the first width in the horizontal direction.

According to some example embodiments of the inventive concepts, an image sensor may include a substrate having a plurality of pixels. Each pixel of the plurality of pixels may include a photoelectric conversion region and a floating diffusion region in the substrate, a pixel transistor including a pixel gate on a first surface of the substrate, a first transmission gate between the photoelectric conversion region and the floating diffusion region and extending into the substrate, and a second transmission gate between the photoelectric conversion region and the floating diffusion region, the second transmission gate between the pixel gate and the first transmission gate when viewed in a plan view, wherein an area of the second transmission gate is smaller than an area of the first transmission gate.

According to some example embodiments of the inventive concepts, an image sensor may include a substrate having a plurality of pixels that are each surrounded by a pixel device isolation layer. Each pixel of the plurality of pixels may include a photoelectric conversion region and a floating diffusion region in the substrate, a pixel transistor including a pixel gate on a first surface of the substrate, a first transmission gate adjacent to the photoelectric conversion region, the first transmission gate extending into the substrate, the first transmission gate having a first width in a horizontal direction extending parallel to the substrate, a second transmission gate adjacent to the photoelectric conversion region, the second transmission gate between the pixel gate and the first transmission gate when viewed in a plan view, the second transmission gate having a second width less than the first width in the horizontal direction, and a color filter on a second surface of the substrate, the second surface opposite to the first surface of the substrate, wherein the first transmission gate has a first height in a vertical direction extending perpendicular to the substrate, and the second transmission gate has a second height that is about 80% to about 120% of a first height in the vertical direction.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
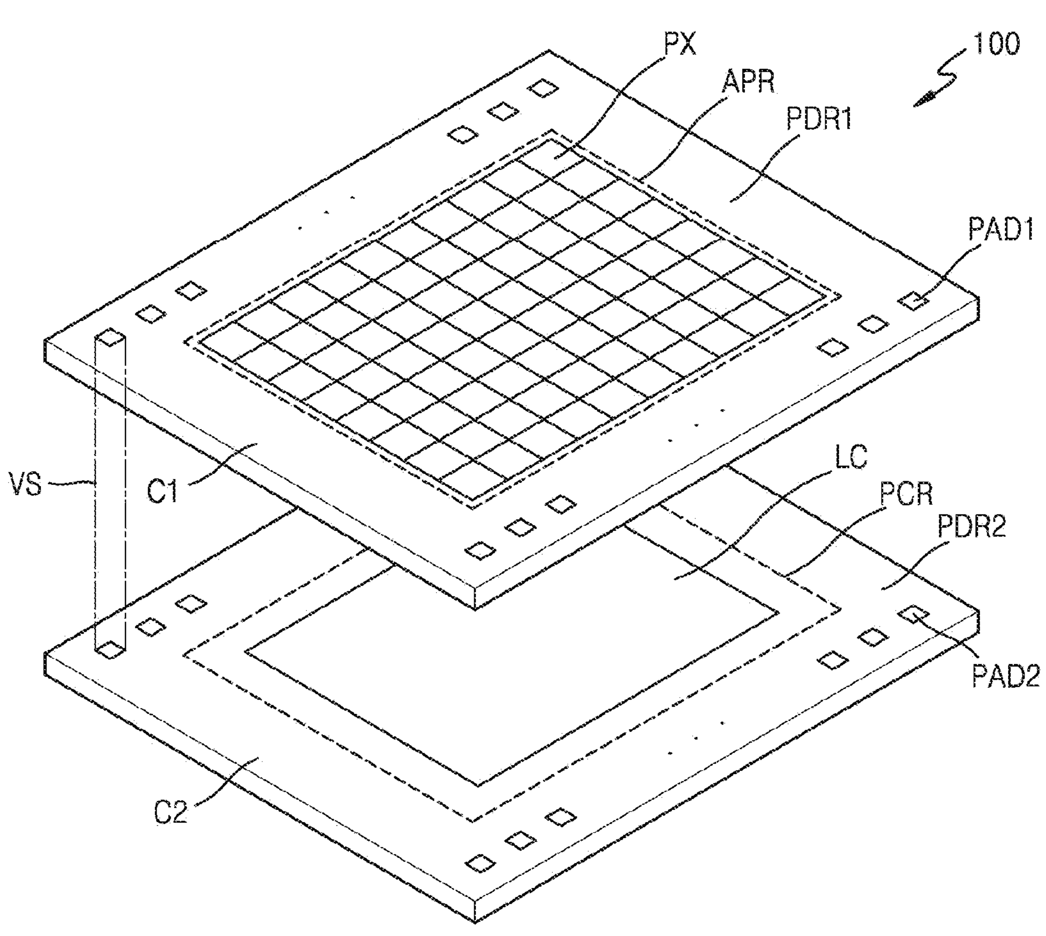
FIG. 1 is a layout diagram illustrating an image sensor according to some example embodiments.

Hereinafter, some example embodiments of the inventive concepts will be described in detail with reference to the accompanying drawings. As those skilled in the art would realize, the described example embodiments may be modified in various different ways, all without departing from the spirit or scope of the present inventive concepts.

In order to clearly describe the present inventive concepts, parts or portions that are irrelevant to the description are omitted, and identical or similar constituent elements throughout the specification are denoted by the same reference numerals.

Further, in the drawings, the size and thickness of each element are arbitrarily illustrated for ease of description, and the present inventive concepts are not necessarily limited to those illustrated in the drawings.

Throughout the specification, when a part is "connected" to another part, it includes not only a case where the part is "directly connected" but also a case where the part is "indirectly connected" with another part in between. In addition, unless explicitly described to the contrary, the word "comprise" and variations such as "comprises" or "comprising" will be understood to imply the inclusion of stated elements but not the exclusion of any other elements.

It will be understood that when an element such as a layer, film, region, area, or substrate is referred to as being "on" or "above" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

The use of the term "the" and similar demonstratives may correspond to both the singular and the plural. Operations constituting methods may be performed in any suitable order unless otherwise indicated herein or otherwise clearly contradicted by context and are not necessarily limited to the stated order.

The use of all illustrations or illustrative terms in some example embodiments is simply to describe the technical ideas in detail, and the scope of the present inventive concepts is not limited by the illustrations or illustrative terms unless they are limited by claims.

It will be understood that elements and/or properties thereof (e.g., structures, surfaces, directions, or the like), which may be referred to as being "perpendicular." "parallel." "coplanar." or the like with regard to other elements and/or properties thereof (e.g., structures, surfaces, directions, or the like) may be "perpendicular," "parallel," "coplanar," or the like or may be "substantially perpendicular." "substantially parallel." "substantially coplanar," respectively, with regard to the other elements and/or properties thereof.

Elements and/or properties thereof (e.g., structures, surfaces, directions, or the like) that are "substantially perpendicular", "substantially parallel", or "substantially coplanar" with regard to other elements and/or properties thereof will be understood to be "perpendicular", "parallel", or "coplanar", respectively, with regard to the other elements and/or properties thereof within manufacturing tolerances and/or material tolerances and/or have a deviation in magnitude and/or angle from "perpendicular", "parallel", or "coplanar", respectively, with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same. While the term "same." "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., +10%).

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially." it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed, or an effect such as a structure is described to be established "by" or "through" performing additional operations, it will be understood that the operation may be performed and/or the effect/structure may be established "based on" the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) and/or described to be "separated from" the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) and/or are described to be "separated" from each other, may be understood to be isolated from direct contact with each other, in general and/or in the particular direction (e.g., isolated from direct contact with each other in a vertical direction, isolated from direct contact with each other in a lateral or horizontal direction, etc.). Similarly, a structure described herein to be between two other structures to separate the two other structures from each other may be understood to be configured to isolate the two other structures from direct contact with each other.

Figure 2:
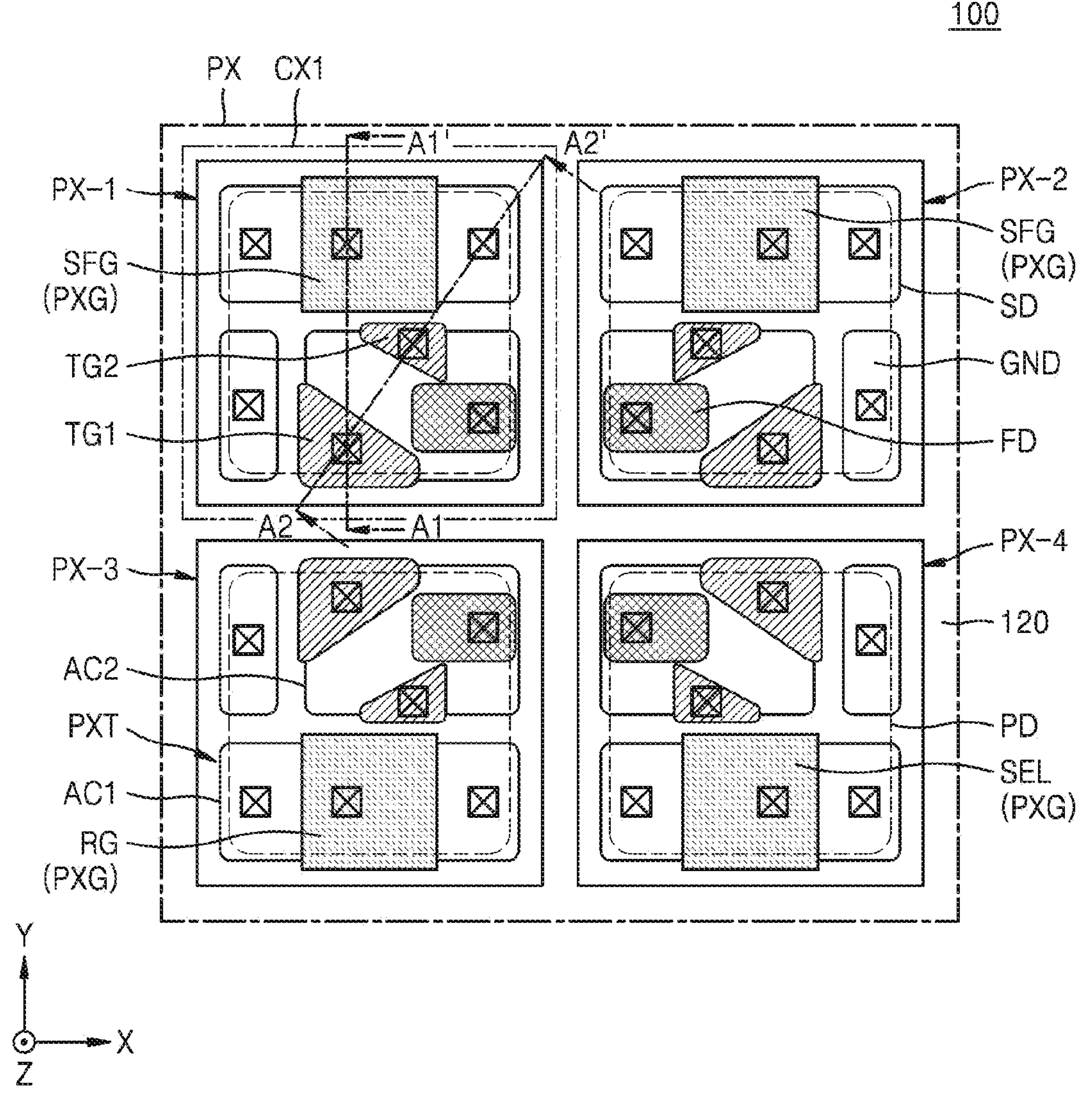
FIG. 2 is an enlarged layout of the pixel of FIG. 1.
Figure 3:
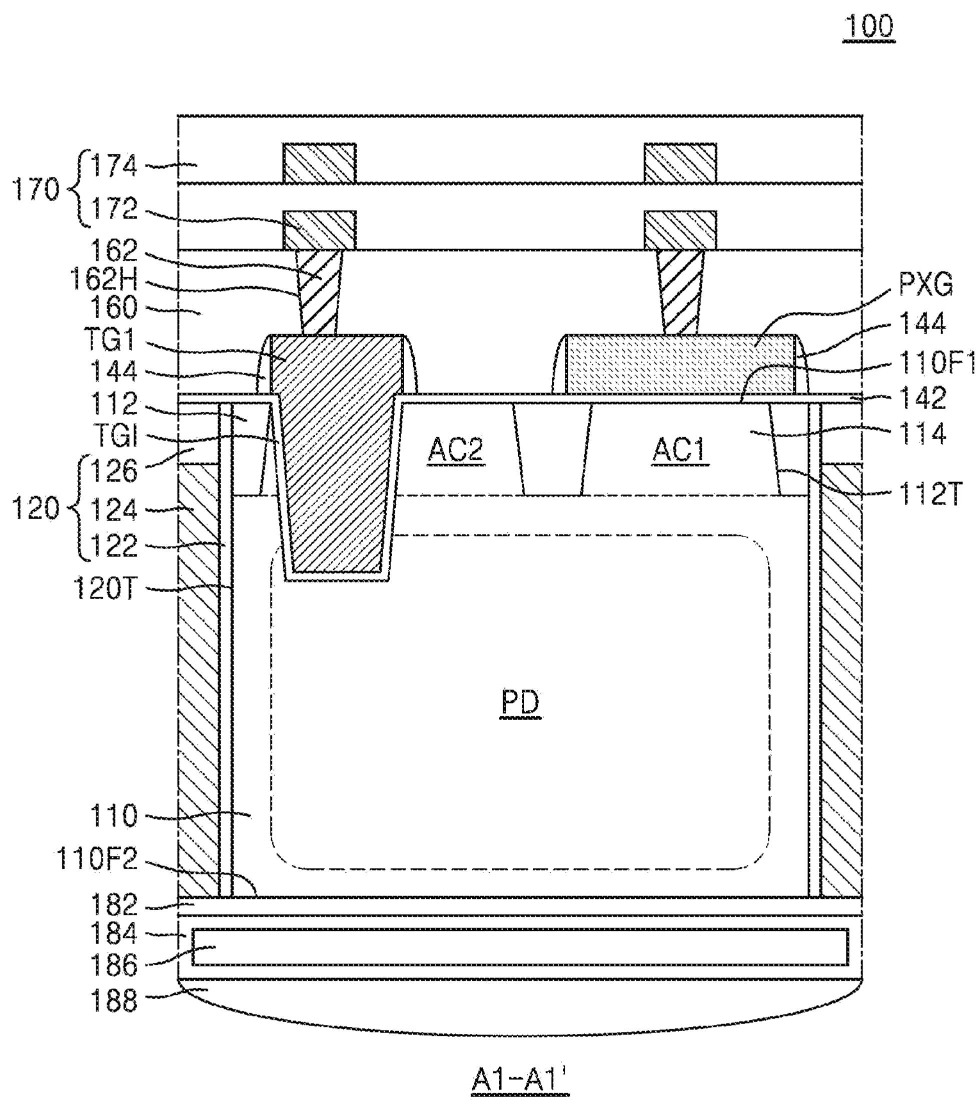
FIG. 3 is a cross-sectional view taken along line A1-A1' of FIG. 2.
Figure 4:
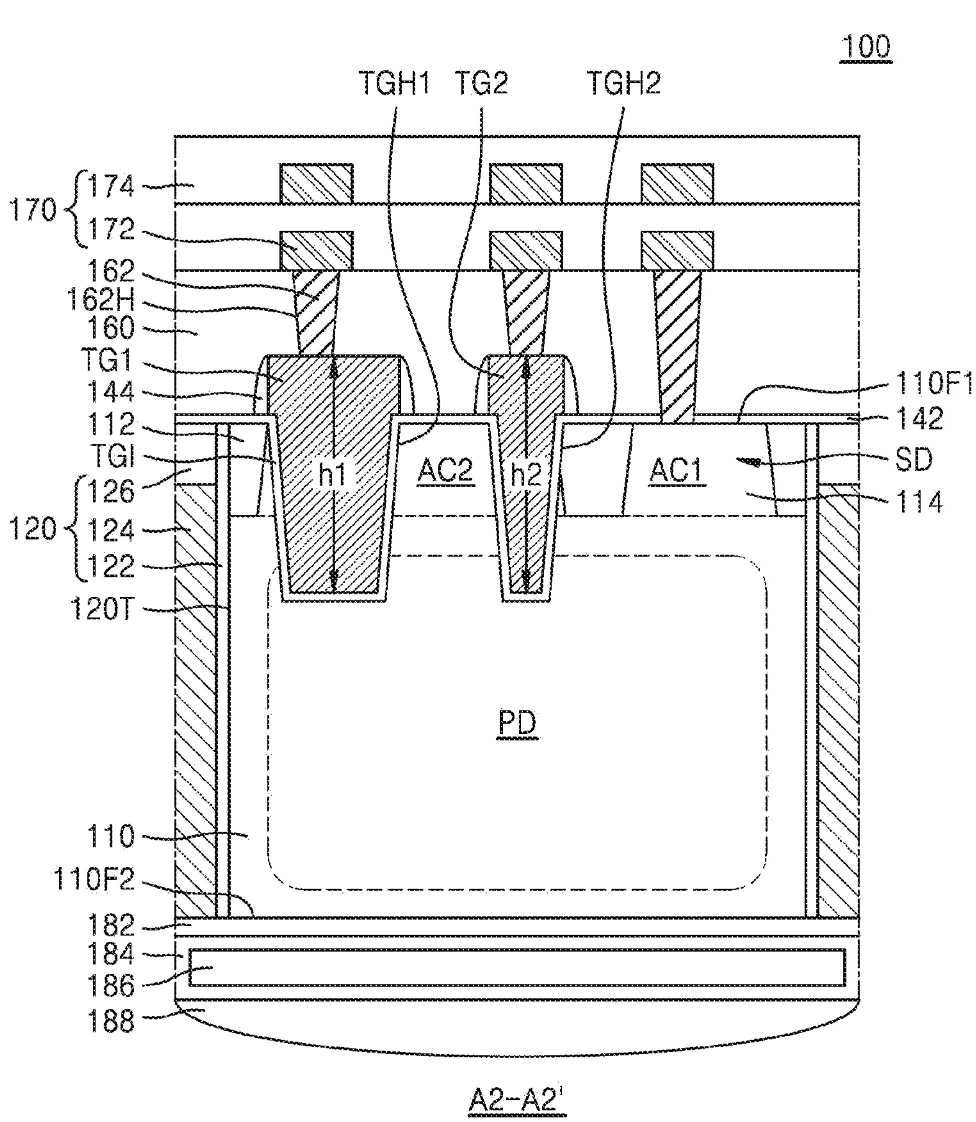
FIG. 4 is a cross-sectional view taken along line A2-A2' of FIG. 2.
Figure 5:
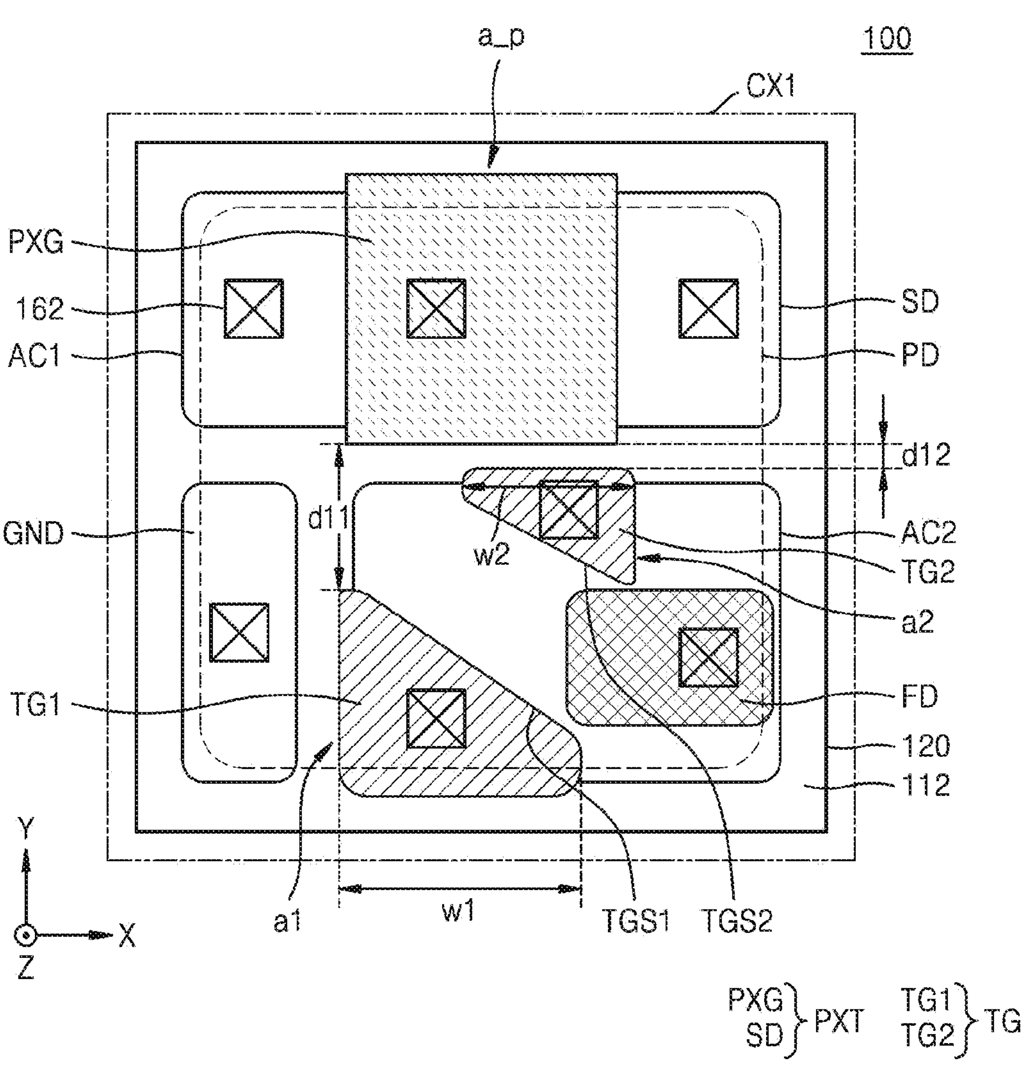
FIG. 5 is an enlarged view of a portion CX1 of FIG. 2.

FIG. 1 is a layout diagram illustrating an image sensor 100 according to some example embodiments. FIG. 2 is an enlarged layout of the pixel PX of FIG. 1. FIG. 3 is a cross-sectional view taken along line A1-A1' of FIG. 2. FIG. 4 is a cross-sectional view taken along line A2-A2' of FIG. 2. FIG. 5 is an enlarged view of a portion CX1 of FIG. 2.

Referring to FIGS. 1 to 5, an image sensor 100 may be a stacked image sensor including a first chip C1 and a second chip C2, which are stacked in a vertical direction. The first chip C1 may include an active pixel region APR and a first pad region PDR1, and the second chip C2 may include a peripheral circuit region PCR and a second pad region PDR2.

A plurality of first pads PAD1 of the first pad region PDR1 may be configured to transmit and receive electrical signals to and from an external device. The peripheral circuit region PCR may include a logic circuit block LC and may include a plurality of CMOS transistors. The peripheral circuit region PCR may provide a constant signal to each pixel PX of the active pixel region APR or control an output signal from each active pixel PX. The first pads PAD1 in the first pad region PDR1 may be electrically connected by via structure VS of the second pads PAD2 in the second pad region PDR2.

The active pixel region APR includes a plurality of pixels PX, and a plurality of photoelectric conversion regions PD may be arranged in each of the pixels PX. In the active pixel region APR, the plurality of pixels PX may be arranged in a matrix shape while forming rows and columns in a first direction X parallel to the top surface of the substrate 110 and in a second direction Y perpendicular to the first direction and parallel to the top surface of the substrate 110.

The substrate 110 may include a first surface 110F1 and a second surface 110F2 opposite to each other. Here, for convenience, the surface of the substrate 110 on which a color filter 186 is arranged is referred to as the second surface 110F2, and the surface opposite to the second surface 110F2 is referred to as the first surface 110F1. However, the technical idea of the inventive concepts is not limited thereto.

In some example embodiments, the substrate 110 may include a p-type substrate. For example, the substrate 110 may include any one of Si, Ge, SiGe, SiC, GaAs, InAs, or InP. For example, the substrate 110 may be formed of a p-type silicon substrate. In some example embodiments, the substrate 110 may include a p-type bulk substrate and a p-type or n-type epitaxial layer grown thereon. In some example embodiments, the substrate 110 may include an n-type bulk substrate and a p-type or n-type epitaxial layer grown thereon. In some example embodiments, the substrate 110 may be formed of an organic plastic substrate. A well region 114 may be arranged inside the substrate 110 adjacent to the first surface 110F1 of the substrate 110. The well region 114 may be a region doped with p-type impurities.

In the active pixel region APR, the plurality of pixels PX may be arranged in a matrix form in the substrate 110. The plurality of photoelectric conversion regions PD may be arranged in each of the plurality of pixels PX, respectively. Restated, each pixel PX of the plurality of pixels PX may include at least one separate photoelectric conversion region PD. Each pixel PX of the plurality of pixels PX of the substrate 110 may include at least one photoelectric conversion region PD and at least one floating diffusion region FD. Restated, each pixel PX of the plurality of pixels PX of the substrate 110 may include a separate set of a photoelectric conversion region PD and a floating diffusion region FD (e.g., a separate set of at least one photoelectric conversion region PD and at least one floating diffusion region FD). The plurality of photoelectric conversion regions PD may be regions in which light incident from the second surface 110F2 of the substrate 110 is converted into electrical signals. The plurality of photoelectric conversion regions PD may be regions including n-type impurities.

In the active pixel region APR, a pixel device isolation layer 120 may be arranged in the substrate 110, and the plurality of pixels PX may be defined in the substrate 110 by the pixel device isolation layer 120. The pixel device isolation layer 120 may be arranged between one of the plurality of photoelectric conversion regions PD and the photoelectric conversion region PD adjacent thereto. One photoelectric conversion region PD and another adjacent photoelectric conversion region PD may be physically and electrically separated by the pixel device isolation layer 120. The pixel device isolation layer 120 may be arranged between the adjacent photoelectric conversion regions PD arranged in a matrix form, and may have a grid or mesh shape when viewed in a plan view.

The pixel device isolation layer 120 may be formed inside a pixel trench 120T penetrating the substrate 110 from the first surface 110F1 to the second surface 110F2 of the substrate 110. The pixel device isolation layer 120 may include an insulating layer 122 conformally formed on the sidewall of the pixel trench 120T, a conductive layer 124 filling the inside of the pixel trench 120T on the insulating layer 122, and an upper insulating layer 126.

In some example embodiments, the insulating layer 122 may include a metal oxide such as hafnium oxide, aluminum oxide, tantalum oxide, and the like. In this case, the insulating layer 122 may act as a negative fixed charge layer, but the technical idea of the inventive concepts is not limited thereto. In some example embodiments, the insulating layer 122 may include an insulating material such as silicon oxide, silicon nitride, or silicon oxynitride. The conductive layer 124 may include at least one of doped polysilicon, metal, metal silicide, metal nitride, or metal-containing layer.

As illustrated as an example in FIG. 3, a device isolation layer 112 defining a first active region AC1, a second active region AC2, and a ground region GND may be formed on the first surface 110F1 of the substrate 110. The device isolation layer 112 may be placed in the device isolation trench 112T formed on the first surface 110F1 of the substrate 110 to a predetermined depth, and may include an insulating material.

Pixel transistors PXT constituting a pixel circuit may be arranged on the first active region AC1. The pixel transistors PXT may include a pixel gate PXG and a source/drain region SD arranged in the first active region AC1 on both sides of the pixel gate PXG. As shown in at least FIGS. 2, 3 and 5, each pixel PX may include at least one pixel transistor PXT including at least a pixel gate PXG on a first surface 110F1 of the substrate 110. The pixel gate PXG may include a source follower gate SFG, a select gate SEL, and a reset gate RG.

In some example embodiments, as illustrated in FIG. 2, a first pixel PX-1, a second pixel PX-2, a third pixel PX-3 and a fourth pixel PX-4 may be arranged in a matrix shape, and the first pixel PX-1 and the third pixel PX-3 arranged side by side in a second direction (Y-axis) may have a mirror shape symmetrically with each other, and the first pixel PX-1 and the second pixel PX-2 arranged side by side in a first direction (X-axis) may have a mirror shape symmetrically with each other.

In some example embodiments, each of the first pixel PX-1 and the second pixel PX-2 may include first and second transmission gates TG1 and TG2 and a source follower gate SFG, the third pixel PX-3 may include first and second transmission gates TG1 and TG2, and a reset gate RG, and the fourth pixel PX-4 may include first and second transmission gates TG1 and TG2, and a select gate SEL. However, the figure shown in FIG. 2 corresponds to the layout of transistors according to some example embodiments, and the layout of the transistors or the shape of the active region is not limited thereto.

In some example embodiments, the first and second transmission gates TG1 and TG2 may constitute a transmission gate TG that may configure a transmission transistor TX (see FIG. 6) and the transmission transistor TX may be configured to transmit electric charges generated in the photoelectric conversion region PD to the floating diffusion region FD, such that the first and second transmission gates TG1 and TG2 in each pixel PX may be understood to be between a photoelectric conversion region PD of the pixel PX and a floating diffusion region FD of the pixel PX (e.g., the first and second transmission gates TG1 and TG2 in each pixel PX may be understood to be between the same photoelectric conversion region PD and floating diffusion region FD of the pixel PX). The reset gate RG may configure a reset transistor RX (see FIG. 6) and the reset transistor RX may be configured to periodically reset charges stored in the floating diffusion region FD. The source follower gate SFG may configure a source follower transistor SFX (see FIG. 6) and the source follower transistor SFX may serve as a source follower buffer amplifier and may be configured to buffer a signal according to charges charged in the floating diffusion region. The select gate SEL may constitute a select transistor SX (see FIG. 5) and the select transistor SX may serve as a switching and addressing function for selecting the pixel PX.

The pixel transistor PXT may include a gate insulating layer 142 arranged on the first surface 110F1 of the substrate 110, a pixel gate PXG arranged on the gate insulating layer 142, and a source/drain region SD. A spacer 144 may be arranged on a sidewall of the pixel gate PXG. The source/drain region SD may be arranged inside the substrate 110 arranged at both sides (e.g., opposite sides) of the pixel gate PXG (or inside the first active region AC1 arranged at both sides of the pixel gate PXG).

In some example embodiments, the pixel gate PXG may include at least one of doped polysilicon, metal, metal silicide, metal nitride, or metal-containing layer. The gate insulating layer 142 may include silicon oxide or metal oxide. The source/drain region SD may be a region doped with n-type impurities.

Each pixel PX may include first and second transmission gates TG1 and TG2 having vertical buried gate structures having different sizes. The first transmission gate TG1 and the second transmission gate TG2 may be arranged to be spaced apart from each other on the second active region AC2 (e.g., spaced apart in a horizontal direction that is parallel to the first surface 110F1 of the substrate 110).

For example, the first transmission gate TG1 may be arranged at a first distance d11 relatively far from the pixel gate PXG (in a first horizontal direction that is parallel to the substrate 110, the first surface 110F1 of the substrate 110, the second surface 110F2 of the substrate 110, or the like, such as the Y direction shown in at least FIGS. 2 and 5), and the second transmission gate TG2 may be arranged at a position adjacent to the pixel gate PXG and at a relatively short second distance d12 from the pixel gate PXG (in the same first horizontal direction that is parallel to the substrate 110, the first surface 110F1 of the substrate 110, the second surface 110F2 of the substrate 110, or the like, such as the Y direction shown in at least FIGS. 2 and 5). For example, the second transmission gate TG2 may be arranged between the pixel gate PXG and the first transmission gate TG1 (e.g., in the first horizontal direction that is parallel to the substrate 110, the first surface 110F1 of the substrate 110, the second surface 110F2 of the substrate 110, or the like, such as the Y direction shown in at least FIGS. 2 and 5). For example, as illustrated in FIG. 2, the first transmission gate TG1 may be arranged at a position adjacent to the pixel device isolation layer 120, for example, close to a peripheral region of the pixel PX (e.g., a region including an outer edge of the pixel PX in a horizontal plane extending parallel to the substrate 110, the first surface 110F1 of the substrate 110, the second surface 110F2 of the substrate 110, or the like, such as the X-Y plane shown in at least FIGS. 2 and 5). The second transmission gate TG2 may be arranged at a position relatively far from the pixel device isolation layer 120, for example, close to the central region of the pixel PX (e.g., a region including a center of the pixel PX in a horizontal plane extending parallel to the substrate 110, the first surface 110F1 of the substrate 110, the second surface 110F2 of the substrate 110, or the like, such as the X-Y plane shown in at least FIGS. 2 and 5).

As illustrated in FIG. 5, the second transmission gate TG2 may have a second width w2 in a horizontal direction that is less (e.g., smaller) than a first width w1 in the horizontal direction of the first transmission gate TG1, where the horizontal direction may be a direction extending parallel to the substrate 110, to a first surface 110F1 of the substrate 110, or the like. As shown in FIGS. 2 and 5, the horizontal direction which the first and second widths w1 and w2 are measured may be the X direction, which may be a second horizontal direction that intersects (e.g., is perpendicular to) a first horizontal direction in which the first and second transmission gates TG1 and TG2 are spaced apart from the pixel gate PXG (e.g., the Y direction in FIG. 5). In some example embodiments, the second width w2 of the second transmission gate TG2 may have a range of about 30% to about 80% of the first width w1. In addition, an area of the second transmission gate TG2 (e.g., an area of the second transmission gate TG2 in a horizontal plane extending parallel to the substrate 110, the first surface 110F1 of the substrate 110, the second surface 110F2 of the substrate 110, or the like, such as the X-Y plane shown in at least FIGS. 2 and 5) may be smaller than an area of the first transmission gate TG1 (e.g., an area of the first transmission gate TG1 in the same horizontal plane extending parallel to the substrate 110, the first surface 110F1 of the substrate 110, the second surface 110F2 of the substrate 110, or the like, such as the X-Y plane shown in at least FIGS. 2 and 5), for example, the region of the first transmission gate TG1 at the same vertical level as the first surface 110F1 of the substrate 110.

As described herein, a "level" or "vertical level" of an element, surface, structure, or the like may be understood to refer to a distance of the element, surface, structure, or the like from a reference location (e.g., the first surface 110F1 of the substrate 110, the second surface 110F2 of the substrate 110, or the like) in a direction that is a vertical direction extending perpendicular to the substrate 110, the first surface 110F1 of the substrate 110, the second surface 110F2 of the substrate 110, or the like. Where elements, surfaces, structures or the like are described herein to be at a same "level" or "vertical level," the elements, surfaces, structures or the like may be at a same distance from the reference location in the vertical direction (e.g., may be coplanar). Where a first element, surface, structure or the like is described herein to be higher or lower, or at a higher or lower level "level" or "vertical level" in relation to a second element, surface, structure or the like, the first element, surface, structure or the like may be further from or closer to, respectively, the reference location in the vertical direction in relation to the second element, surface, structure or the like.

In some example embodiments, including the example embodiments illustrated in FIG. 5, the first transmission gate TG1 and the second transmission gate TG2 may have a triangular shape with rounded corners, for example, have a right triangular shape with rounded corners. For example, a hypotenuse of the first transmission gate TG1 may face a hypotenuse of the second transmission gate TG2, for example such that the respective surfaces TGS1 and TGS2 defined by the respective hypotenuses of the first and second transmission gates TG1 and TG2 may be at least partially opposing surfaces in the plan view (e.g., the X-Y plane).

When viewed in a plan view, a floating diffusion region FD may be arranged in the second active region AC2 between the first transmission gate TG1 and the second transmission gate TG2. The floating diffusion region FD may be arranged to be spaced apart from the first transmission gate TG1 and the second transmission gate TG2 by a similar distance. For example, the first transmission gate TG1 may include a first side surface TGS1 facing the floating diffusion region FD, the second transmission gate TG2 may include a second side surface TGS2 facing the floating diffusion region FD, and the floating diffusion region FD may be arranged between the first transmission gate TG1 and the second transmission gate TG2 so that the separation distance between the first side surface TGS1 and the floating diffusion region FD is similar to the separation distance between the second side TGS2 and the floating diffusion region FD.

As illustrated in FIG. 4, the first transmission gate TG1 and the second transmission gate TG2 may be arranged in the first transmission gate trench TGH1 and the second transmission gate trench TGH2 extending in a vertical direction Z extending perpendicular to the substrate 110, the first surface 110F1 of the substrate 110, the second surface 110F2 of the substrate 110, or the like (e.g., the Z direction), from the first surface 110F1 of the substrate 110 to the inside (e.g., interior) of the substrate 110, respectively. Bottom portions of the first transmission gate TG1 and the second transmission gate TG2 may be surrounded by the photoelectric conversion region PD. The gate insulating layer 142 may extend from the first surface 110F1 of the substrate 110 to the inner wall of the first transmission gate trench TGH1 and the inner wall of the second transmission gate trench TGH2. A portion of the gate insulating layer 142 arranged on the inner wall of the first transmission gate trench TGH1 and the inner wall of the second transmission gate trench TGH2 may be referred to as a transmission gate insulating layer TGI.

In some example embodiments, the first transmission gate TG1 may have a first height h1 in a vertical direction Z, and the second transmission gate TG2 may have a second height h2 in a vertical direction Z. In some example embodiments, the second height h2 may correspond to about 50% to about 150% of the first height h1. In some example embodiments, the second height h2 may correspond to about 80% to about 120% of the first height h1.

In some example embodiments, the first height h1 of the first transmission gate TG1 may range from about 0.2 micrometers to about 0.6 micrometers, and the second height h2 of the second transmission gate TG2 may range from about 0.1 micrometers to about 0.9 micrometers. In some example embodiments, the second height h2 of the second transmission gate TG2 may have a range of about 0.1 micrometers to about 0.5 micrometers, and in some example embodiments, the second height h2 of the second transmission gate TG2 may have a range of about 0.3 micrometers to about 0.5 micrometers.

When the second height h2 of the second transmission gate TG2 is greater than about 0.9 micrometers, the aspect ratio of the second transmission gate trench TGH2 may increase, causing a defect in the process for forming the second transmission gate TG2 inside the second transmission gate trench TGH2. Conversely, when the second height h2 of the second transmission gate TG2 is less than about 0.1 micrometers, the separation distance from the photoelectric conversion region PD may increase, and thus gate performance by the second transmission gate TG2 may decrease.

In some example embodiments, portions of the first and second transmission gates TG1 and TG2 may protrude onto the first surface 110F1 of the substrate 110 to each have a top surface arranged at the same level as (e.g., coplanar with) the top surface of the pixel gate PXG, and spacers 144 may also be arranged on sidewalls of the first and second transmission gates TG1 and TG2.

According to some example embodiments, the pixel gate PXG may have a relatively large size (e.g., a relatively large volume and/or a relatively large area a_p in the plan view or horizontal plane extending parallel to the substrate 110, the first surface 110F1 of the substrate 110, the second surface 110F2 of the substrate 110, or the like, where the volume and/or the area a_p of the pixel gate PXG may be greater than the corresponding volume and/or area of the first transmission gate TG1 and/or the combined volume and/or area, respectively, of both the first and second transmission gates TG1 and TG2), and the second transmission gate TG2 arranged between the pixel gate PXG and the first transmission gate TG1 may have a smaller size (e.g., smaller volume and/or smaller area in the plan view or horizontal plane) than the first transmission gate TG1. For example, the first and second transmission gates TG1 and TG2 may respective areas a1 and a2 in the plan view or horizontal plane extending parallel to the substrate 110, the first surface 110F1 of the substrate 110, the second surface 110F2 of the substrate 110, or the like, where a2 is smaller than a1. Accordingly, noise of the pixel PX may be reduced or source follower gain characteristics may be improved, and thus performance of the pixel PX and any image sensor or electronic device including same may be improved, based on the second transmission gate TG2 having a smaller size than the first transmission gate TG1, where such smaller size may be based on the second transmission gate TG2 having at least one dimension (e.g., width w2 in the X direction, area a2 in the X-Y plane, volume, etc.) that is smaller than a corresponding dimension of the first transmission gate TG1 (width w1 in the X direction, area a1 in the X-Y plane, volume, etc.). In addition, even if the separation distance between the pixel gate PXG and the second transmission gate TG2 is short, local interference of the dopant in the ion implantation process for injecting impurity ions into the pixel PX may be reduced, minimized, or prevented, and a potential hump-free potential profile may be obtained through the photoelectric conversion region PD inside the pixel PX, and thus the movement of electrons from the photoelectric conversion region PD to the floating diffusion region FD in the pixel PX may be unhindered by any potential hump, and thus performance of the pixel PX and any image sensor or electronic device including same may be improved, based on the second transmission gate TG2 having a smaller size than the first transmission gate TG1 such that the potential hump-free potential profile may be obtained and the movement of electrons from the photoelectric conversion region PD to the floating diffusion region FD in the pixel PX is improved.

A buried insulating layer 160 may be arranged on the first surface 110F1 of the substrate 110. The buried insulating layer 160 may cover the ground region GND, the floating diffusion region FD, the device isolation layer 112, the pixel gate PXG, and the transmission gate TG. In some example embodiments, the buried insulating layer 160 may include silicon nitride or silicon oxynitride.

A contact 162 penetrating the buried insulating layer 160 may be arranged on the first surface 110F1 of the substrate 110. For example, the contact 162 may penetrate the buried insulating layer 160 and be electrically connected to the active region ACT, the transmission gate TG, and the pixel gate PXG.

In some example embodiments, one contact 162 may be arranged on the top surface of the transmission gate TG. The contact 162 may be disposed on each of the first transmission gate TG1 and the second transmission gate TG2.

An upper wiring structure 170 may be arranged on the buried insulating layer 160. The upper wiring structure 170 may be formed in a stacked structure of a plurality of layers. The upper wiring structure 170 may include a wiring layer 172 and an insulating layer 174 surrounding the wiring layer 172. The wiring layer 172 may include at least one of polysilicon doped with or not doped with impurities, metal, metal silicide, metal nitride, or a metal-containing layer. For example, the wiring layer 172 may include tungsten, aluminum, copper, tungsten silicide, titanium silicide, tungsten nitride, titanium nitride, doped polysilicon, etc. The insulating layer 174 may include an insulating material such as silicon oxide, silicon nitride, or silicon oxynitride.

A rear insulating layer 182 may be arranged on the second surface 110F2 of the substrate 110. The rear insulating layer 182 may be arranged on the entire region or substantially the entire region of the second surface 110F2 of the substrate 110, and the rear insulating layer 182 may contact the top surface of the pixel device isolation layer 120 arranged at the same level as the second surface 110F2 of the substrate 110. In some example embodiments, the rear insulating layer 182 may include a metal oxide such as hafnium oxide, aluminum oxide, tantalum oxide, and the like. In some example embodiments, the rear insulating layer 182 may include an insulating material such as silicon oxide, silicon nitride, silicon oxynitride, and a low dielectric constant material.

A passivation layer 184 may be arranged on the rear insulating layer 182, and a color filter 186 and a microlens 188 may be arranged on the passivation layer 184. Optionally, a support substrate (not shown) may be further arranged on the first surface 110F1 of the substrate 110.

In general, as the pixel size decreases, the size of the pixel gate decreases, and the distance between the pixel gate (e.g., PXG) and the transmission gate (e.g., TG) also decreases. Accordingly, there is a problem in which the noise of the pixel increases or the performance of the pixel gate (e.g., source follower gain) decreases. In addition, in the ion implantation process for injecting impurity ions into the pixel, the transmission gate or pixel gate acts as a barrier, resulting in a non-uniform dopant distribution in the photoelectric conversion region.

However, according to some example embodiments, the pixel gate PXG may have a relatively large size (e.g., relatively large area in the X-Y plane), thereby reducing noise of the pixel PX or improving source follower gain characteristics. In addition, the second transmission gate TG2 arranged between the pixel gate PXG and the first transmission gate TG1 may have a size (e.g., volume, area in the X-Y plane, one or more dimensions in the X-Y plane, etc.) smaller than the first transmission gate TG1. Accordingly, even if the separation distance between the pixel gate PXG and the second transmission gate TG2 is short, local interference of the dopant in the ion implantation process for injecting impurity ions into the pixel PX may be reduced, minimized, or prevented, and a potential hump-free potential profile may be obtained in the photoelectric conversion region PD inside the pixel PX, and thus performance of the pixel PX and any image sensor or electronic device including same may be improved, based on the second transmission gate TG2 having a smaller size (e.g., smaller volume, area, one or more dimensions, etc.) than the first transmission gate TG1 such that the potential hump-free potential profile may be obtained and the movement of electrons from the photoelectric conversion region PD to the floating diffusion region FD in the pixel PX is improved.

Figure 6:
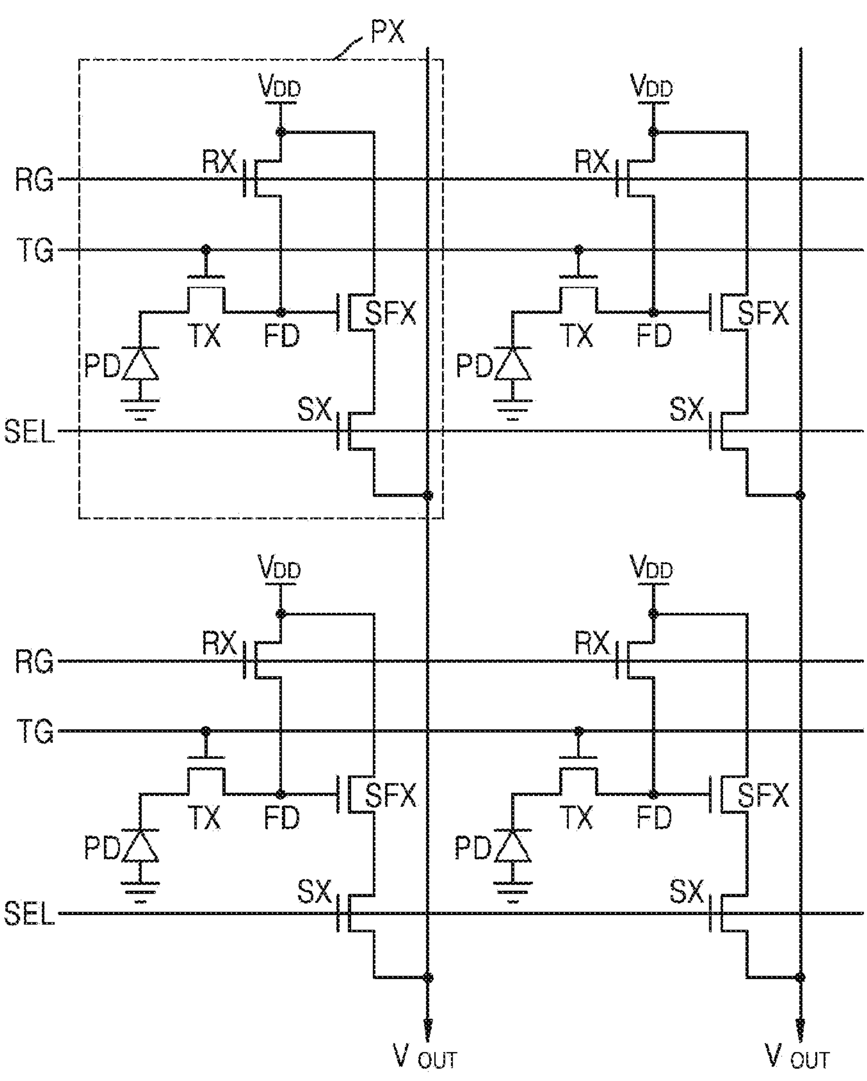
FIG. 6 is an equivalent circuit diagram of a pixel of an image sensor according to some example embodiments.

FIG. 6 is an equivalent circuit diagram of a pixel PX of an image sensor 100 according to some example embodiments.

Referring to FIG. 6, a plurality of pixels PX may be arranged in a matrix form. Each of the plurality of pixels PX may include a transmission transistor TX and logic transistors. Here, the logic transistors may include a reset transistor RX, a select transistor SX, and a source follower transistor SFX. The reset transistor RX may include a reset gate RG, the select transistor SX may include a select gate SEL, the source follower transistor SFX may include a source follower gate, and the transmission transistor TX may include a transmission gate TG.

Each of the plurality of pixels PX may further include a photoelectric conversion region PD and a floating diffusion region FD. The photoelectric conversion region PD may generate and accumulate photo charges in proportion to the amount of light incident from the outside, and may use a photo diode, a photo transistor, a photo gate, a pinned photo diode (PPD), and a combination thereof.

The transmission gate TG may transmit the charges generated in the photoelectric conversion region PD to the floating diffusion region FD. The floating diffusion region FD may receive and accumulate charges generated in the photoelectric conversion region PD. The source follower transistor SFX may be controlled according to the amount of photo charges accumulated in the floating diffusion region FD.

The reset transistor RX may periodically reset charges accumulated in the floating diffusion region FD. The drain electrode of the reset transistor RX is connected to the floating diffusion region FD, and the source electrode thereof is connected to the power supply voltage VDD). When the reset transistor RX is turned on, the power voltage VDD connected to the source electrode of the reset transistor RX is transmitted to the floating diffusion region FD. When the reset transistor RX is turned on, charges accumulated in the floating diffusion region FD may be discharged to reset the floating diffusion region FD.

The source follower transistor SFX is connected to a current source (not shown) located outside the plurality of pixels PX to function as a source follower buffer amplifier, amplifying potential changes in the floating diffusion region FD, and outputting the amplified potential changes to the output line $V_{OUT}$.

The select transistor SX may output an output signal (e.g., an analog pixel signal) of the source follower transistor SFX to a column line in response to a select signal.

Figure 7:
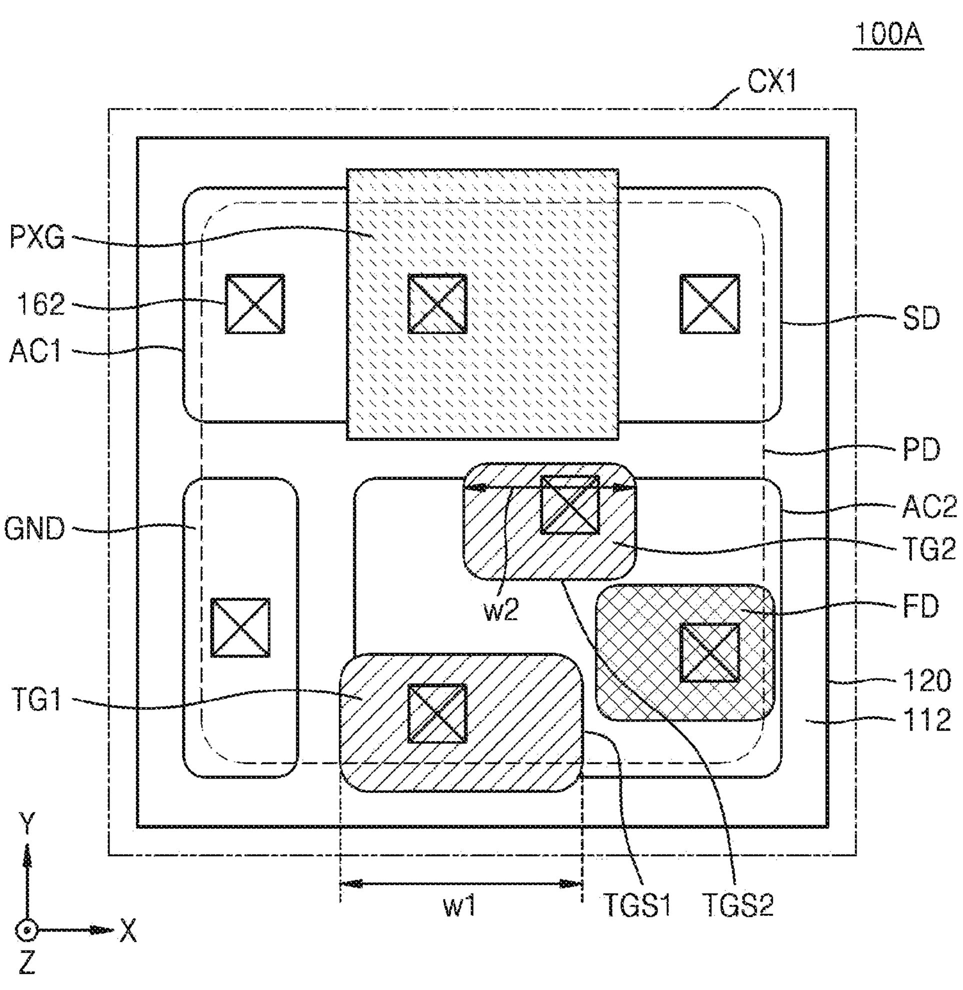
FIGS. 7, 8, and 9 are plan views illustrating an image sensor according to some example embodiments.
Figure 8:
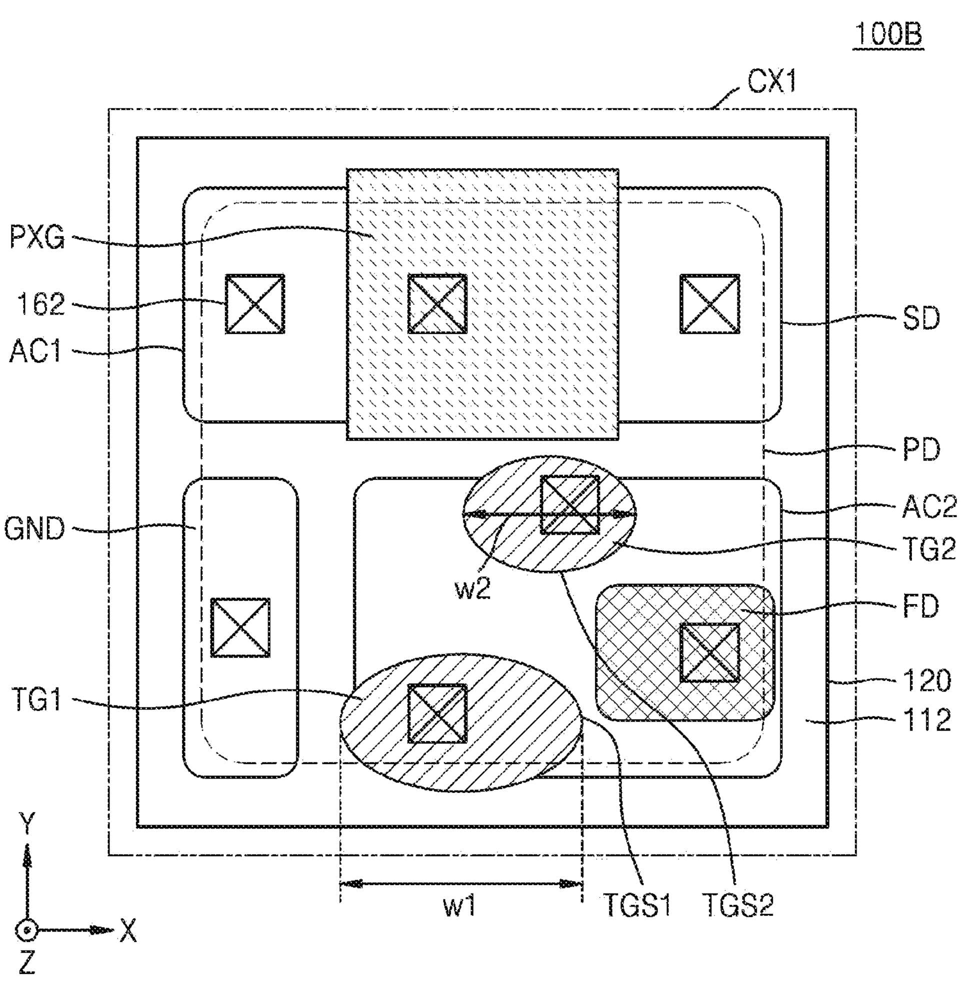
Figure 9:
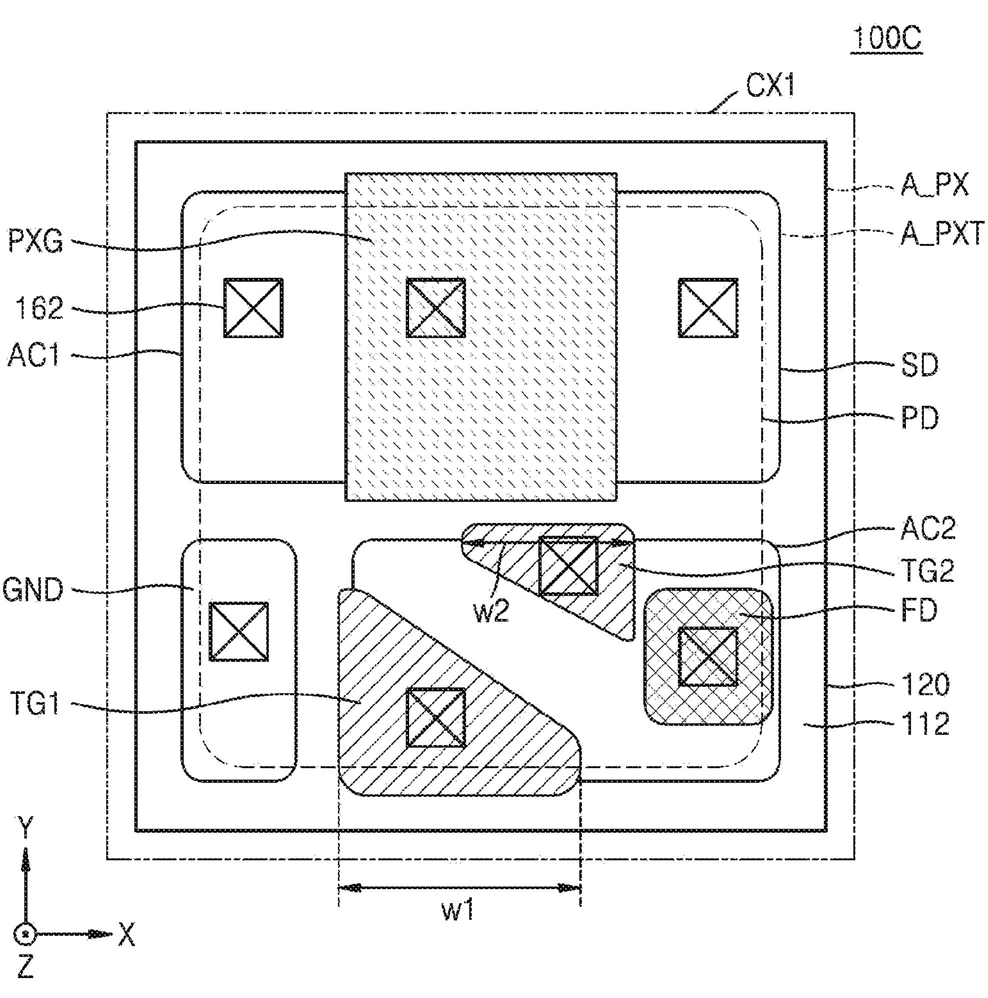

FIGS. 7, 8, and 9 are plan views illustrating an image sensor according to some example embodiments.

Referring to FIG. 7, in an image sensor 100A, the first and second transmission gates TG1 and TG2 may have a horizontal cross-sectional shape of a rounded rectangular shape. For example, the first transmission gate TG1 may have a horizontal cross-sectional shape of a rounded rectangular shape extending in the first horizontal direction X, and may have a first width w1 in the first horizontal direction X. The second transmission gate TG2 may have a horizontal cross-sectional shape of a rounded rectangular shape extending in the first horizontal direction X, and the second transmission gate TG2 may have a second width w2 less than the first width w1 in the first horizontal direction X.

Referring to FIG. 8, in an image sensor 100B, the first and second transmission gates TG1 and TG2 may have an elliptical horizontal cross-sectional shape. For example, the first transmission gate TG1 may have an oval horizontal cross-sectional shape extending with a major axis in the first horizontal direction X, and may have the first width w1 in the first horizontal direction X. The second transmission gate TG2 may have an oval horizontal cross-sectional shape extending with a major axis in the first horizontal direction X, and the second transmission gate TG2 may have the second width w2 less than the first width w1 in the first horizontal direction X.

Referring to FIG. 9, in an image sensor 100C, the pixel gate PXG may have a relatively large size and a relatively large area. In some example embodiments, the area A_PXT of the pixel transistor PXT configured by the pixel gate PXG and the first active region AC1 may be about 50% or more of the area A_PX of the pixel PX. In some example embodiments, the area A_PXT of the pixel transistor PXT including the pixel gate PXG and the first active region AC1 may be in a range of about 50% to about 80%, or in a range of about 60% to about 70% of the area A_PX of the pixel PX. Here, the area A_PX of the pixel PX may be defined as an area of the partial region of the substrate 110 surrounded by the pixel device isolation layer 120, and the area A_PXT of the pixel transistor PXT may be defined as the area of the first active region ACTI surrounded by the device isolation layer 112.

According to some example embodiments, the pixel gate PXG may have a relatively large size, thereby reducing noise of the pixel PX or improving source follower gain characteristics. In addition, the second transmission gate TG2 arranged between the pixel gate PXG and the first transmission gate TG1 may have a size smaller than the first transmission gate TG1. Accordingly, even if the separation distance between the pixel gate PXG and the second transmission gate TG2 is short, local interference of the dopant in the ion implantation process for injecting impurity ions into the pixel PX may be prevented, and a potential hump-free potential profile may be obtained in the photoelectric conversion region PD inside the pixel PX.

Figure 10:
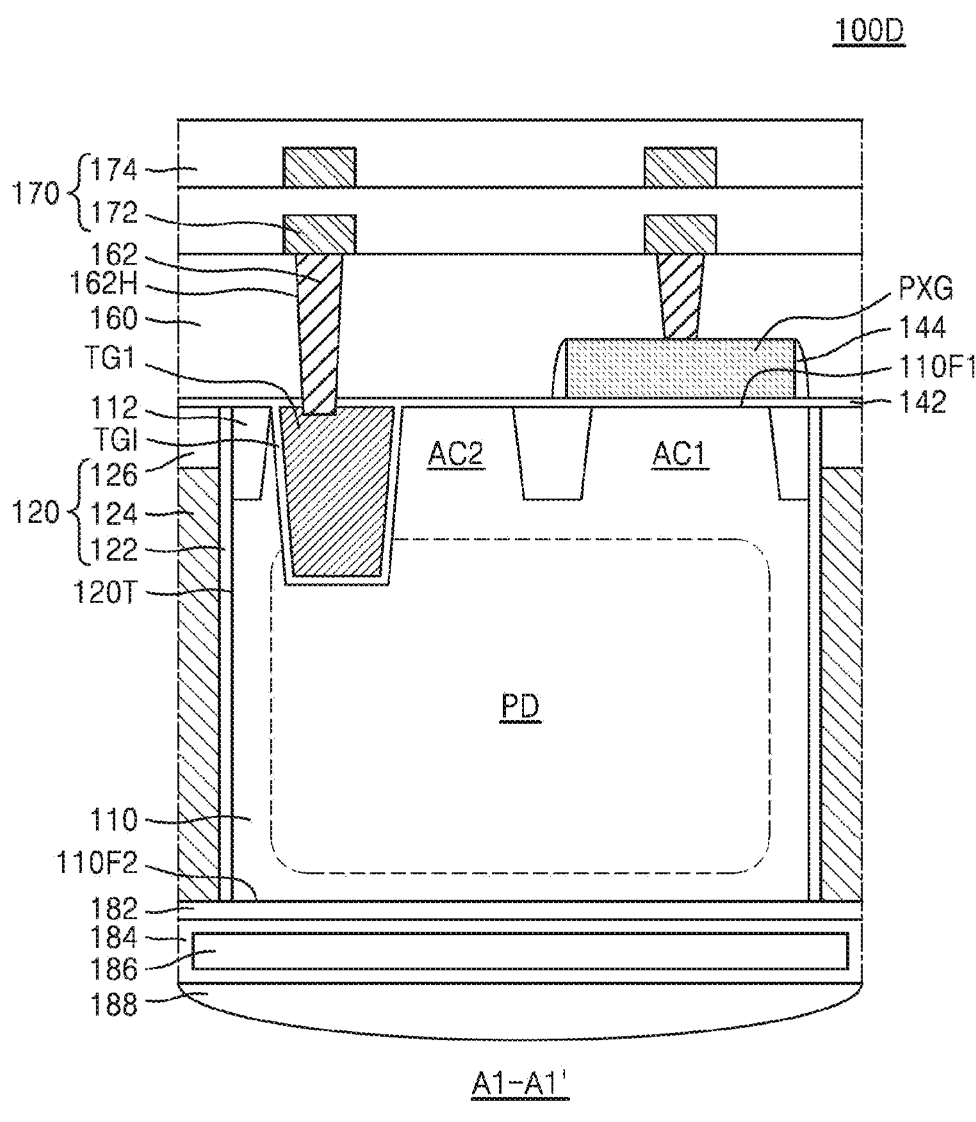
FIGS. 10 and 11 are cross-sectional views illustrating an image sensor according to some example embodiments.
Figure 11:
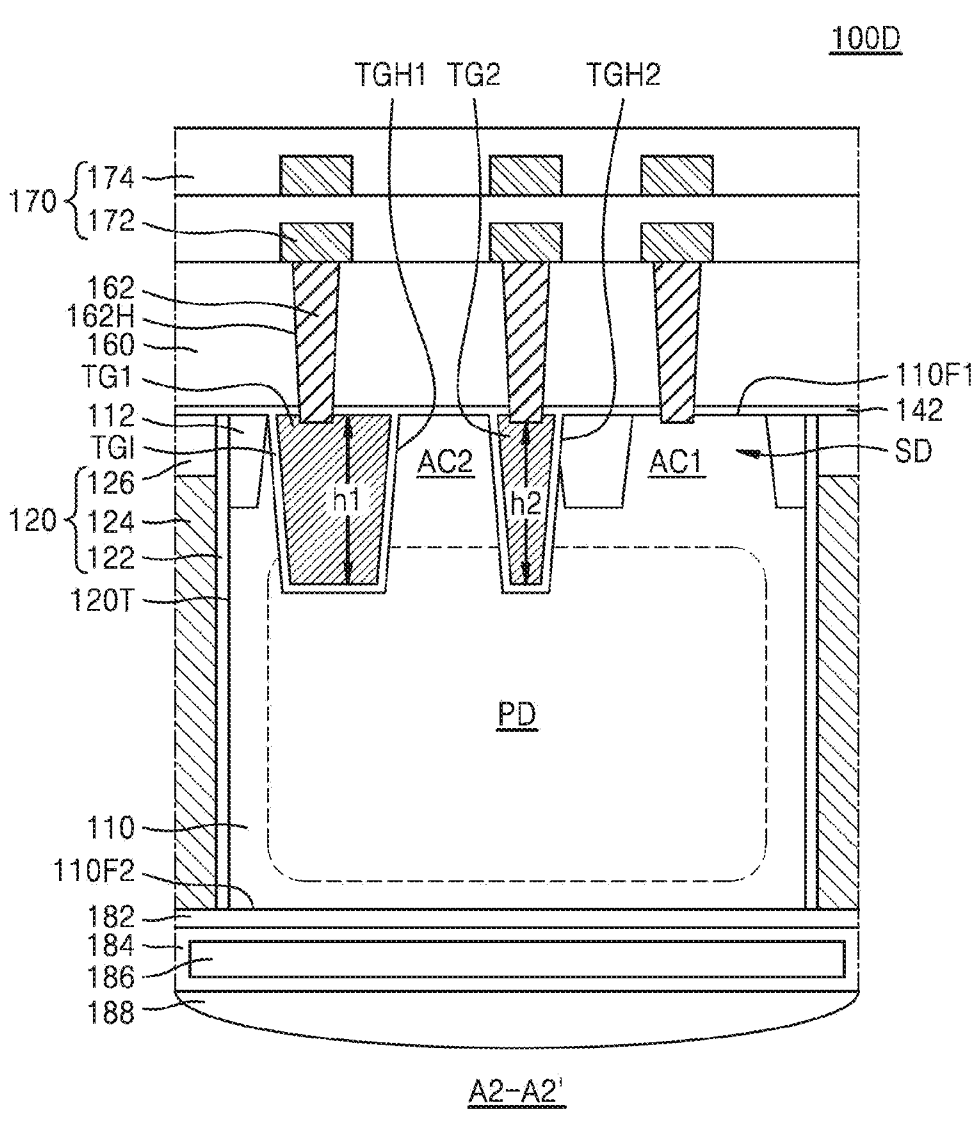

FIGS. 10 and 11 are cross-sectional views illustrating an image sensor 100D according to some example embodiments.

Referring to FIGS. 10 and 11, the top surfaces of the first transmission gate TG1 and the second transmission gate TG2 may be arranged at a lower level than the top surface of the pixel gate PXG. For example, a top surface of the first transmission gate TG1 may be arranged at the same vertical level as the first surface 110F1 of the substrate 110 or at a lower vertical level than the first surface 110F1 of the substrate 110. In addition, a top surface of the second transmission gate TG3 may be arranged at the same vertical level as the first surface 110F1 of the substrate 110 or at a lower vertical level than the first surface 110F1 of the substrate 110. For example, an insulating layer or spacer layer covering the top surface of the first transmission gate TG1 may be further arranged in the first transmission gate trench TGH1, and an insulating layer or spacer layer covering the top surface of the second transmission gate TG2 may be arranged in the second transmission gate trench TGH2.

In some example embodiments, the first transmission gate TG1 may have a first height h1 in a vertical direction Z, and the second transmission gate TG2 may have a second height h2 in a vertical direction Z. In some example embodiments, the second height h2 may correspond to about 80% to about 120% of the first height h1. In some example embodiments, the first height h1 of the first transmission gate TG1 may range from about 0.3 micrometers to about 0.5 micrometers, and the second height h2 of the second transmission gate TG2 may range from about 0.2 micrometers to about 0.6 micrometers. In some example embodiments, the second height h2 of the second transmission gate TG2 may have a range of about 0.3 micrometers to about 0.5 micrometers.

Figure 12:
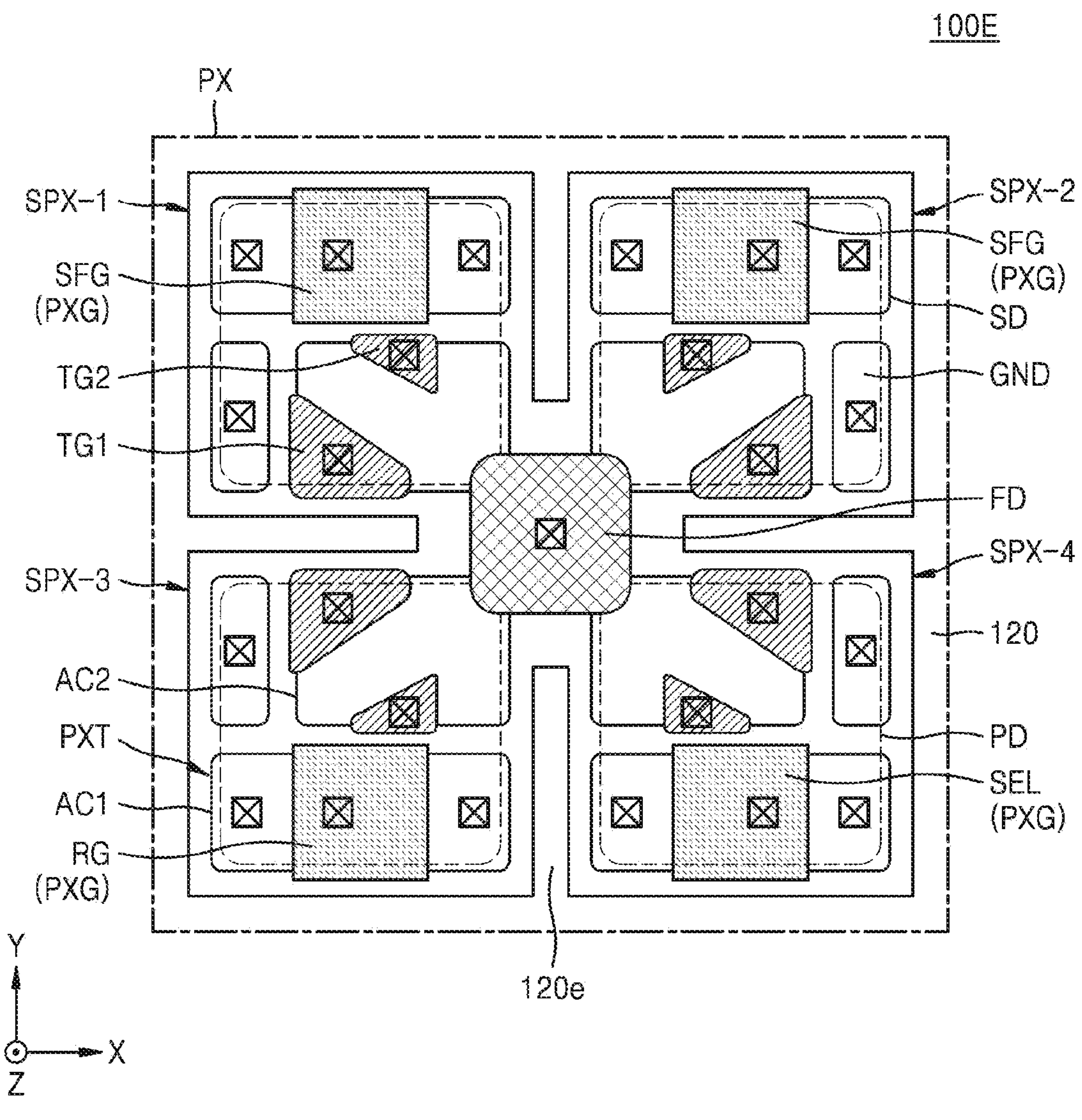
FIG. 12 is a plan view illustrating an image sensor according to some example embodiments.

FIG. 12 is a plan view illustrating an image sensor 100E according to some example embodiments.

Referring to FIG. 12, a plurality of photoelectric conversion regions PD may be arranged in one pixel PX surrounded by the pixel device isolation layer 120. For example, one pixel PX may include first to fourth sub-pixel regions SPX-1, SPX-2, SPX-3, and SPX-4, and first to fourth photoelectric conversion regions PD1, PD2, PD3, and PD4 may be arranged in the first to fourth sub-pixel regions SPX-1, SPX-2, SPX-3, and SPX-4, respectively. A floating diffusion region FD may be arranged in a central region of one pixel PX. The first to fourth sub-pixel regions SPX-1. SPX-2, SPX-3, and SPX-4 may share one floating diffusion region FD, and four photoelectric conversion regions PD may be arranged adjacent to the floating diffusion region FD.

In some example embodiments, the pixel device isolation layer 120 may include a lateral extension portion 120*e* extending in the first direction X and the second direction Y toward the center of the pixel PX. Lateral extension portions 120*e* may be arranged between two sub-pixel regions SPX arranged in the first direction X and between two sub-pixel regions SPX arranged in the second direction Y, respectively. In some example embodiments, a part of the lateral extension portion 120*e* arranged in the central region of the pixel PX may extend from the second surface 110F2 of the substrate 110 to a lower level than the first surface 110F1 of the substrate 110, without completely penetrating the substrate 110.

Figure 13:
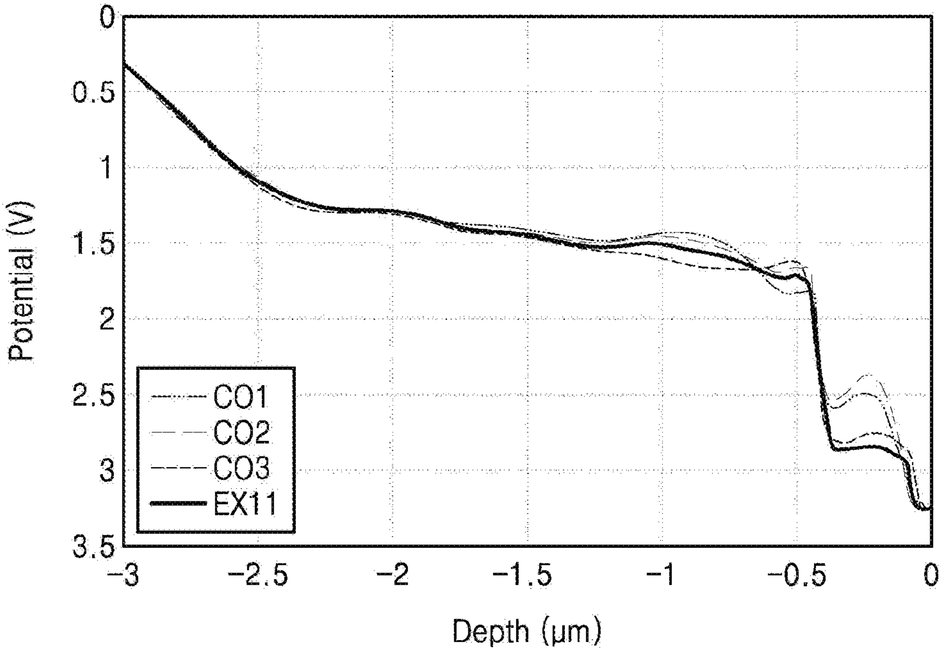
FIG. 13 is a graph illustrating a potential according to a substrate depth of an image sensor according to some example embodiments.

FIG. 13 is a graph illustrating a potential according to a substrate depth of an image sensor according to some example embodiments.

In FIG. 13, comparative example 1 CO1 corresponds to an image sensor with a single transmission gate and a relatively small-sized pixel gate, comparative example 2 CO2 corresponds to an image sensor with a single transmission gate and a relatively large-sized pixel gate, and comparative example 3 CO3 corresponds to an image sensor with a dual transmission gate and a relatively large-sized pixel gate. An example embodiment 11 EX11 corresponds to an image sensor having an asymmetric transmission gate and a relatively large-sized pixel gate, wherein the image sensor includes a first transmission gate TG1 having a wide width and a second transmission gate TG2 having a narrow width.

As illustrated in FIG. 13, in general, the comparative examples 1 to 3 CO1, CO2, and CO3 tend to increase a potential (or change downward in the graph) as the substrate depth decreases from about −3 micrometers to about 0 micrometers, but show the phenomena in which the potential profile is reversed (or changed to a less value in the graph or changed upward) at some positions (for example, at a depth of about −0.5 micrometers or about −0.25 micrometers). These phenomena may be referred to as a potential hump. For example, when a potential hump occurs in the substrate, the movement of electrons from the photoelectric conversion region to the floating diffusion region may be hindered by the potential hump, thereby increasing the noise of the pixel.

Meanwhile, the example embodiment 11 EX11 may exhibit a tendency for potential to increase (or change downward in the graph) in the entire region as the substrate depth decreases from about −3 micrometers to about 0 micrometers, and no potential hump is observed, thereby indicating that an image sensor or electronic device including the example embodiment 11 EX11 may exhibit improved performance (e.g., reduced pixel noise, improved source follower gain characteristics) due to the absence of such potential hump and thus the movement of electrons from the photoelectric conversion region to the floating diffusion region in the example embodiment 11 EX11 is not hindered by such a potential hump.

Figure 14:
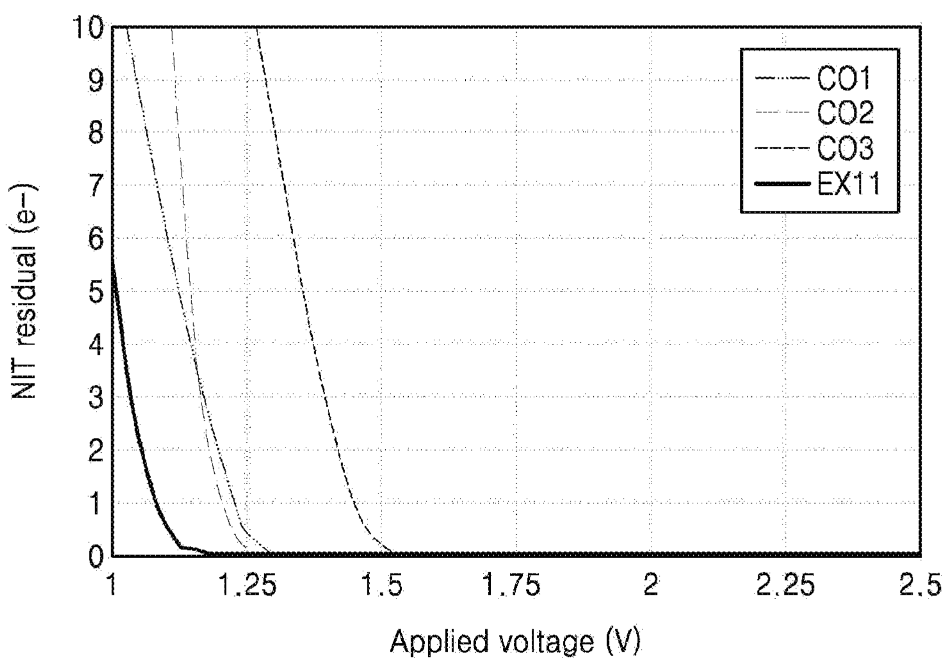
FIG. 14 is a graph illustrating residual electrons in a non-effective integration time (NIT) interval with respect to a voltage applied to an image sensor according to some example embodiments.

FIG. 14 is a graph illustrating residual electrons in a non-effective integration time (NIT) interval with respect to an applied voltage of an image sensor according to some example embodiments.

As shown in FIG. 14, in the comparative examples 1 to 3 CO1, CO2, and CO3, residual electrons in the NIT section are onset at a relatively high applied voltage and thus, the residual electrons in the NIT section increase as the applied voltage decreases. However, in the example embodiment 11 EX11, residual electrons in the NIT section are onset at a relatively low applied voltage (for example, about 1.2 V), and the example embodiment 11 EX11 has a reduced residual electron value compared to the comparative examples 1 to 3 CO1, CO2, and CO3.

Figure 15:
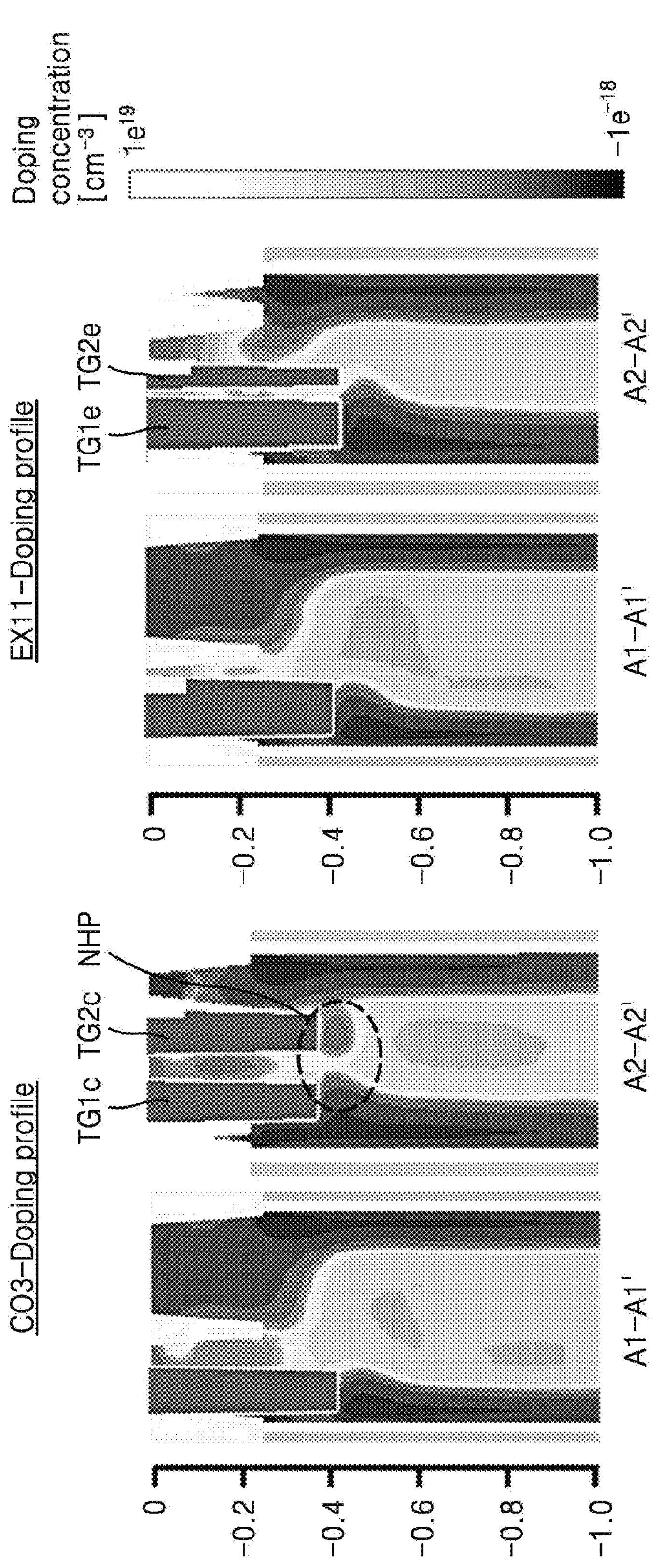
FIG. 15 is a mapping image illustrating a doping profile of an image sensor according to some example embodiments.

FIG. 15 is a mapping image illustrating a doping profile of an image sensor according to some example embodiments. In FIG. 14, dopant concentrations in the substrates of the comparative example 3 CO3 and the example embodiment 11 EX11 are indicated on a gray scale.

Referring to FIG. 15, when two transmission gates TG1*c* and TG2*c* having the same size are formed in the comparative example 3 CO3, a non-homogeneous portion (NHP) having a local dopant content (for example, under the second transmission gate TG2*c*) may be formed between the two transmission gates TG1*c* and TG2*c* and/or under the two transmission gates TG1*c* and TG2*c*. This may be assumed to be due to a phenomenon in which the injection of impurity ions is hindered in the ion injection process by the second transmission gate TG2*c* arranged in the central region of the pixel. Meanwhile, when the second transmission gate TG2*e* is formed to have a width less than that of the first transmission gate TG1*e* in the example embodiment 11 EX11, a relatively uniform dopant content distribution may be obtained between the first transmission gate TG1*e* and the second transmission gate TG2*e* and/or under the two transmission gates TG1*e* and TG2*e*. This may be assumed to be because the second transmission gate TG2*e* arranged in the central region of the pixel is formed to have a relatively narrow width, thereby reducing, minimizing, or preventing a phenomenon of hindering the injection of impurity ions in the ion injection process and thereby improving the performance of an image sensor or electronic device including the example embodiment 11 EX11.

Figure 16:
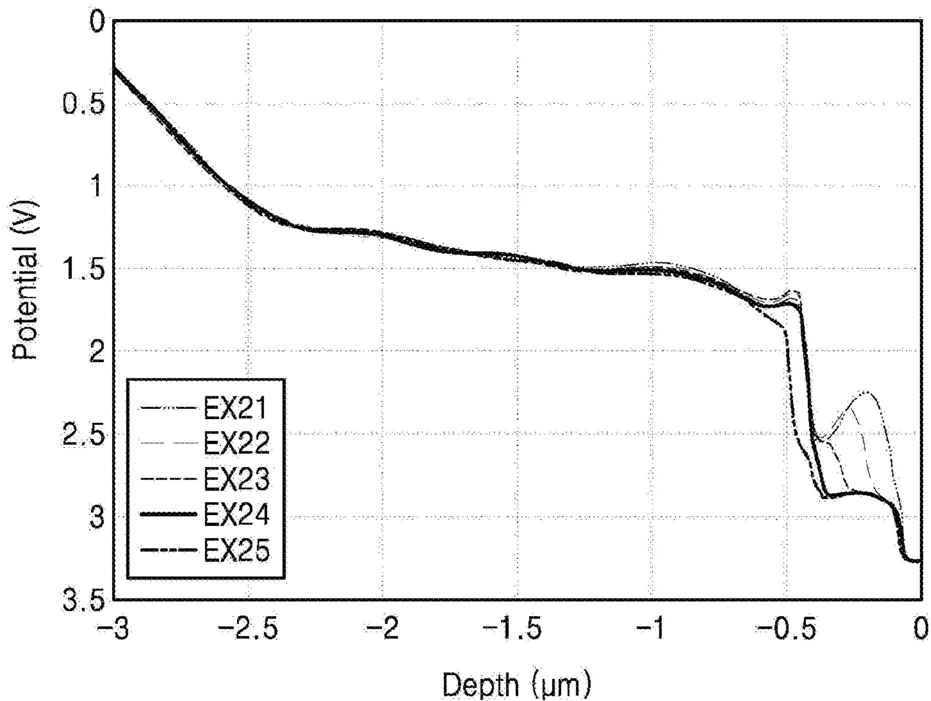
FIG. 16 is a graph illustrating a potential according to a substrate depth of an image sensor according to some example embodiments.

FIG. 16 is a graph illustrating a potential according to a substrate depth of an image sensor according to some example embodiments. In FIG. 16, potential profiles according to substrate depth are plotted with respect to some example embodiments, including example embodiments in which heights of the second transmission gate are different.

Referring to FIG. 16, examples 21 to 25 EX21, EX22, EX23, EX24, and EX25 have asymmetric dual transmission gate structures. For example, the examples 21 to 25 EX21, EX22, EX23, EX24, and EX25) may have a second transmission gate with a second height h2 (see FIG. 4) of 0.1, 0.2, 0.3, 0.4, and 0.5 micrometers, approximately, respectively, and the first height h1 of the first transmission gate is set to about 0.4 micrometers.

The examples 23 to 25 EX23, EX24, and EX25 may exhibit a tendency for the potential to increase (or change downward in the graph) in the entire region as the substrate depth decreases from about −3 micrometers to about 0 micrometers, and no potential hump is observed.

According to simulation results described with reference to FIGS. 13 to 16, it may be confirmed that the image sensor according to some example embodiments may have reduced noise and excellent operation characteristics (e.g., improved gain) and thus improved performance.

Figure 17:
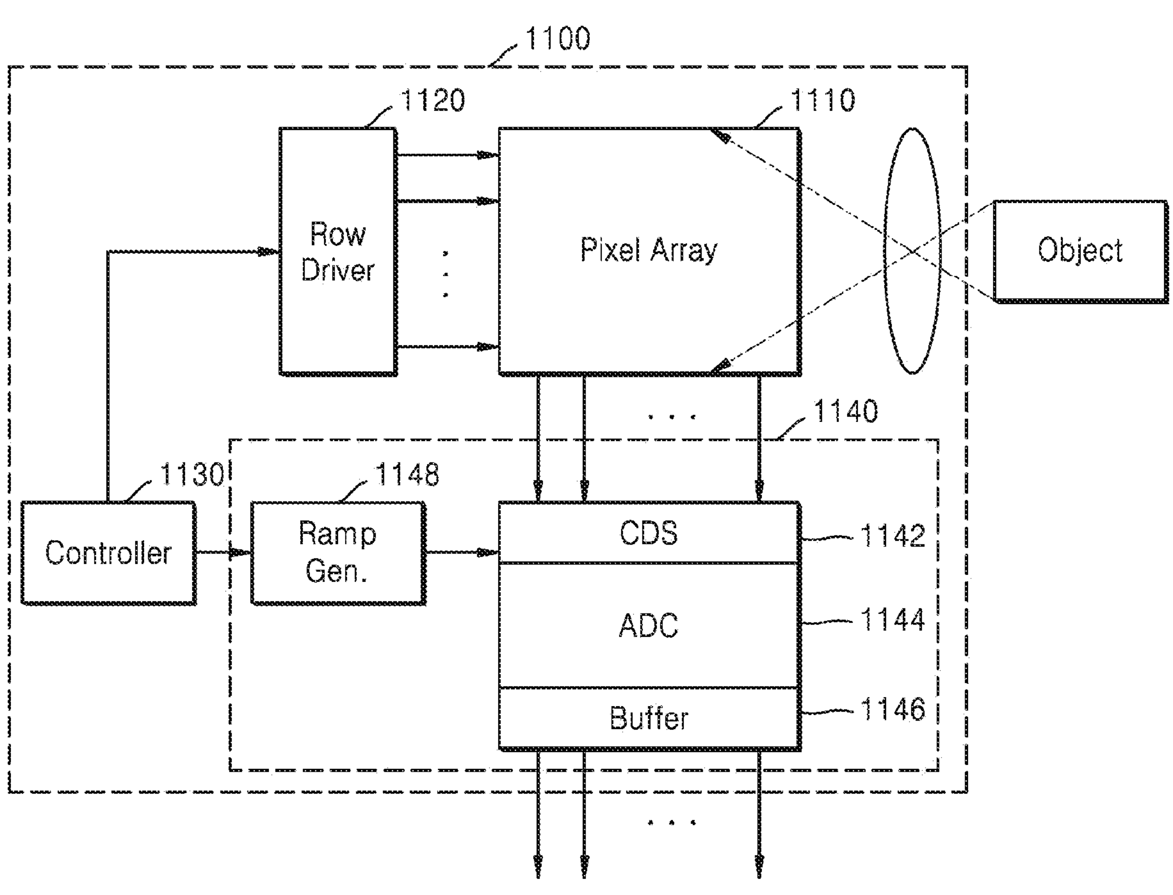
FIG. 17 is a block diagram illustrating a configuration of an image sensor according to some example embodiments.

FIG. 17 is a block diagram illustrating a configuration of an image sensor 1100 according to some example embodiments.

Referring to FIG. 17, the image sensor 1100 may include a pixel array 1110, a controller 1130, a row driver 1120, and a pixel signal processing unit 1140. The image sensor 1100 includes at least one of the image sensors 100, 100A, 100B, 100C, 100D, and 100E described in FIGS. 1 to 12.

The pixel array 1110 may include a plurality of unit pixels two-dimensionally arranged, and each unit pixel may include a photoelectric conversion device. The photoelectric conversion device may absorb light to generate electric charges, and an electrical signal (output voltage) according to the generated electric charge may be provided to the pixel signal processing unit 1140 through a vertical signal line. The unit pixels included in the pixel array 1110 may provide output voltage one at a time in row units, and accordingly, unit pixels belonging to one row of the pixel array 1110 may be simultaneously activated by a select signal output by the row driver 1120. The unit pixels belonging to the selected row may provide an output voltage according to the absorbed light to an output line of the corresponding column.

The controller 1130 may control the row driver 1120 so that the pixel array 1110 absorbs light to accumulate charges, temporarily store the accumulated charges, and output an electrical signal according to the stored charges to the outside of the pixel array 1110. In addition, the controller 1130 may control the pixel signal processing unit 1140 to measure the output voltage provided by the pixel array 1110.

The pixel signal processing unit 1140 may include a correlation double sampler (CDS) 1142, an analog-to-digital converter (ADC) 1144, and a buffer 1146. The correlation double sampler 1142 may sample and hold the output voltage provided by the pixel array 1110. The correlation double sampler 1142 may double-sample a specific noise level and a level according to the generated output voltage and output a level corresponding to the difference. In addition, the correlation double sampler 1142 may receive a ramp signal generated by a ramp signal generator 1148 and compare the received ramp signal with the output voltage of the pixel array 1110 each other to output a comparison result.

An analog-to-digital converter 1144 may convert an analog signal corresponding to a level received from the correlation double sampler 1142 into a digital signal. A buffer 1146 may latch a digital signal, and the latched signal may be sequentially output to the outside of the image sensor 1100 and transmitted to an image processor (not shown).

As described herein, any devices, systems, units, blocks, circuits, controllers, processors, and/or portions thereof according to any of the example embodiments (including, for example, the image sensor 100, the image sensor 100A, the image sensor 100B, the image sensor 100B, the image sensor 100C, the image sensor 100D, the image sensor 100E, the image sensor 1100, the pixel array 1110, the row driver 1120, the controller 1130, the pixel signal processing unit 1140, the correlation double sampler (CDS) 1142, the analog-to-digital converter (ADC) 1144, the buffer 1146, the ramp signal generator 1148, any portion thereof, or the like) may include, may be included in, and/or may be implemented by one or more instances of processing circuitry such as hardware including logic circuits; a hardware/software combination such as a processor executing software; or any combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a DRAM device, storing a program of instructions, and a processor (e.g., CPU) configured to execute the program of instructions to implement the functionality and/or methods performed by some or all of any devices, systems, units, blocks, circuits, controllers, processors, and/or portions thereof according to any of the example embodiments.

While the inventive concepts have been particularly shown and described with reference to some example embodiments thereof, it will be understood that various changes in form and details may be made therein without departing from the spirit and scope of the following claims.

What is claimed is:

1. An image sensor, comprising:

a substrate having a plurality of pixels, each pixel of the plurality of pixels including:

a photoelectric conversion region and a floating diffusion region in the substrate, a pixel transistor including a pixel gate on a first surface of the substrate, a first transmission gate between the photoelectric conversion region and the floating diffusion region, the first transmission gate extending into the substrate, the first transmission gate having a first width in a horizontal direction extending parallel to the substrate, and a second transmission gate between the photoelectric conversion region and the floating diffusion region, the second transmission gate between the pixel gate and the first transmission gate in a plan view, the second transmission gate having a second width less than the first width in the horizontal direction.

2. The image sensor of claim 1, wherein the second width is in a range of about 30% to about 80% of the first width.

3. The image sensor of claim 1, wherein the first transmission gate includes a first side surface facing the floating diffusion region, and the second transmission gate includes a second side surface facing the floating diffusion region.

4. The image sensor of claim 1, wherein the first transmission gate has a first height in a vertical direction extending perpendicular to the substrate, the second transmission gate has a second height in the vertical direction, and the second height is in a range of about 80% to about 120% of the first height.

5. The image sensor of claim 4, wherein the second height is in a range of about 0.1 micrometers to about 0.9 micrometers.

6. The image sensor of claim 4, wherein the second height is in a range of about 0.3 micrometers to about 0.5 micrometers.

7. The image sensor of claim 1, wherein an area of the second transmission gate is smaller than an area of the first transmission gate.

8. The image sensor of claim 1, wherein the first transmission gate is spaced apart from the pixel gate by a first distance, the second transmission gate is spaced apart from the pixel gate by a second distance, and the second distance is less than the first distance.

9. The image sensor of claim 1, further comprising:

a pixel device isolation layer in a pixel device isolation trench extending from the first surface of the substrate to a second surface of the substrate, the second surface opposite to the first surface of the substrate, the pixel device isolation layer surrounding each of the plurality of pixels, wherein, in each pixel of the plurality of pixels, the second transmission gate of the each pixel is farther from the pixel device isolation layer than the first transmission gate of the each pixel.

10. The image sensor of claim 9, wherein, in each pixel of the plurality of pixels, the first transmission gate of the each pixel is in a peripheral region of the each pixel, and the second transmission gate of the each pixel is in a central region of the each pixel.

11. The image sensor of claim 1, wherein, in each pixel of the plurality of pixels, the pixel transistor of the each pixel has an area of about 50% or more of an area of the each pixel.

12. An image sensor, comprising:

a substrate having a plurality of pixels, each pixel of the plurality of pixels including:

a photoelectric conversion region and a floating diffusion region in the substrate;

a pixel transistor including a pixel gate on a first surface of the substrate;

a first transmission gate between the photoelectric conversion region and the floating diffusion region, the first transmission gate extending into the substrate; and a second transmission gate between the photoelectric conversion region and the floating diffusion region, the second transmission gate between the pixel gate and the first transmission gate when viewed in a plan view, wherein an area of the second transmission gate is smaller than an area of the first transmission gate.

13. The image sensor of claim 12, wherein the first transmission gate includes a first side surface facing the floating diffusion region, and the second transmission gate includes a second side surface facing the floating diffusion region.

14. The image sensor of claim 12, wherein the first transmission gate has a first height in a vertical direction extending perpendicular to the substrate, the second transmission gate has a second height in the vertical direction, and the second height is in a range of about 80% to about 120% of the first height.

15. The image sensor of claim 14, wherein the second height is in a range of about 0.1 micrometers to about 0.9 micrometers.

16. The image sensor of claim 12, wherein the first transmission gate is spaced apart from the pixel gate by a first distance, the second transmission gate is spaced apart from the pixel gate by a second distance, and the second distance is less than the first distance.

17. The image sensor of claim 12, wherein the first transmission gate has a first width in a horizontal direction extending parallel to the substrate, and the second transmission gate has a second width less than the first width in the horizontal direction.

18. An image sensor, comprising:

a substrate having a plurality of pixels that are each surrounded by a pixel device isolation layer, each pixel of the plurality of pixels including:

a photoelectric conversion region and a floating diffusion region in the substrate;

a pixel transistor including a pixel gate on a first surface of the substrate;

a first transmission gate adjacent to the photoelectric conversion region, the first transmission gate extending into the substrate, the first transmission gate having a first width in a horizontal direction extending parallel to the substrate;

a second transmission gate adjacent to the photoelectric conversion region, the second transmission gate between the pixel gate and the first transmission gate when viewed in a plan view, the second transmission gate having a second width less than the first width in the horizontal direction; and a color filter on a second surface of the substrate, the second surface opposite to the first surface of the substrate, wherein:

the first transmission gate has a first height in a vertical direction extending perpendicular to the substrate, and the second transmission gate has a second height that is about 80% to about 120% of the first height in the vertical direction.

19. The image sensor of claim 18, wherein the second height is in a range of about 0.1 micrometers to about 0.9 micrometers.

20. The image sensor of claim 18, wherein the first transmission gate is spaced apart from the pixel gate by a first distance, the second transmission gate is spaced apart from the pixel gate by a second distance, and the second distance is less than the first distance.

* * * * *